(12) United States Patent
Kondo et al.

(10) Patent No.: US 6,561,883 B1
(45) Date of Patent: May 13, 2003

(54) METHOD OF POLISHING (75) Inventors: Seiichi Kondo, Kokubunji (JP); Noriyuki Sakuma, Hachioji (JP); Yoshio Homma, Hinode (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/548,289

(22) Filed: Apr. 12, 2000

(30) Foreign Application Priority Data

Apr. 13, 1999 (JP) .......................................... 11-104882

(51) Int. Cl.⁷ ................................................ B24B 1/00
(52) U.S. Cl. ...................... 451/63; 451/41; 156/345.11; 51/307; 438/691
(58) Field of Search ............................ 451/60, 63, 446, 451/36, 37, 38, 39, 41; 156/344, 345.11, 345.12; 51/307, 308; 438/692, 691, 689

(56) References Cited

U.S. PATENT DOCUMENTS

| | | | | |
|---|---|---|---|---|
| 4,126,276 A | * | 11/1978 | Manfroy et al. ............... | 451/35 |
| 4,900,409 A | * | 2/1990 | Vunderink .................... | 451/36 |
| 5,664,990 A | * | 9/1997 | Adams et al. ................. | 451/60 |
| 5,773,364 A | * | 6/1998 | Farkas et al. ................ | 451/287 |
| 5,860,848 A | * | 1/1999 | Loncki et al. ................ | 451/36 |
| 6,019,667 A | * | 2/2000 | Bush et al. ................... | 451/36 |
| 6,022,400 A | * | 2/2000 | Izumi et al. .................. | 451/36 |
| 6,121,143 A | * | 9/2000 | Messner et al. ........ | 156/345.12 |
| 6,126,528 A | * | 10/2000 | Sedlock ....................... | 451/390 |
| 6,171,352 B1 | * | 1/2001 | Lee et al. ..................... | 51/307 |
| 6,190,237 B1 | * | 2/2001 | Huynh et al. ................. | 451/41 |
| 6,206,756 B1 | * | 3/2001 | Chopra et al. ................ | 451/28 |
| 6,217,416 B1 | * | 4/2001 | Kaufman et al. ............. | 451/41 |

FOREIGN PATENT DOCUMENTS

JP 2-278822 11/1990

OTHER PUBLICATIONS

Monthly Semiconductor World, May 1995, pp. 172–173. (Japanese).
CMP Process Cost, May 1996 (Japanese).
Journal Electrochemical Society, vol. 141, No. 10, Oct. 1994, "Pattern Geometry Effects in the Chemical–Mechanical Polishing of Inlaid Copper Structures", J. Steigerwald et al, pp. 2842–2848.
Journal Electrochemical Society, vol. 142, No. 1, Jan. 1, 1995, "Postchemical–Mechanical Planarization Cleanup Process for Interlayer Dielectric Films", S. Roy et al, pp. 216–226.
Science of CMP, Aug. 1997, pp. 299–300. Japanese.

* cited by examiner

Primary Examiner—Eileen P. Morgan
Assistant Examiner—Hadi Shakeri
(74) Attorney, Agent, or Firm—Mattingly, Stanger & Malur, P.C.

(57) ABSTRACT

A polishing method comprising mechanically polishing the surface of a metal film by the use of a polishing solution comprising an oxidizer, a substance which renders an oxide water-soluble, a thickener and water, is suitable for polishing the metal film at a high removal rate with suppressed scratching, delamination, dishing and erosion, and can be applied to production of semiconductors, etc.

21 Claims, 6 Drawing Sheets

METHOD OF POLISHING

BACKGROUND OF THE INVENTION

The present invention relates to a method for polishing a metal film, and particularly to a polishing method in the process of forming inlaid interconnect of semiconductor devices.

In view of the recent tendency to increase the degree of integration of semiconductor integrated circuits (hereinafter, referred to as LSI) and to improve the performance thereof, new techniques of micro fabrication are being developed. The chemical mechanical polishing method is one of these new techniques, and frequently utilized for the planarization of interlayer dielectric film, the formation of metal plugs and the formation of inlaid interconnect in the production of LSI and especially in the multilevel metallization fabrication process. This technique is disclosed in, for example, U.S. Pat. No. 4,944,836.

In the recent years, there is an attempt to replace the prior art aluminum alloys used as the wiring material by copper alloy of low resistance in order to improve the high-speed performance of LSI. However, micro fabrication of copper alloys is difficult to carry out according to the dry etching method, though it has frequently been used in the formation of aluminum alloy wiring. Thus, the so-called damascene method, which is a method of forming an inlaid interconnect by depositing thin films of copper alloy on a grooved insulating film and removing the copper alloy thin film by the CMP method only from the portions not inlaid in the grooves, is predominantly adopted. This technique is disclosed in, for example, JP-A 2-278822. Usually, TiN film, Ta film, TaN film or the like having a thickness of several tens nm are inserted between the insulating film and the copper alloy thin film for the purpose of improving the adhesion and forming a copper diffusion barrier.

Further, for formation of metal plug, tungsten is sometimes used according to the chemical vapor deposition (CVD) method because of its good inlaid characteristics. In this case, too, plug is mostly formed by CMP similarly to the above case, even though the etchback method is also usable.

The polishing slurries used for CMP of metal films such as copper alloy films, etc. generally contain an abrasive and an oxidizer (oxidizer is sometimes called oxidant) as main ingredients thereof. The fundamental mechanism of CMP consists in oxidizing the metal surface by the oxidizing action of oxidizer while mechanically removing the resulting oxide with the abrasive. This mechanism is disclosed in "The Science of CMP", edited by Masahiro Kashiwagi, published by Science Forum K. K., Aug. 20 (1997), page 299.

As the solid abrasive, alumina abrasive and silica abrasive having a particle size of several tens to several hundreds nm are known. Of these abrasives, most of the commercially available ones used for polishing metals belong to the alumina abrasive.

As the oxidizer, hydrogen peroxide ($H_2O_2$), ferric nitrate ($Fe(NO_3)_3$) and potassium periodate ($KIO_3$) are generally used. These oxidizers are disclosed in pages 299–300 of the above-cited book ("The Science of CMP"). Of these oxidizers, hydrogen peroxide has become used largely particularly in the recent years because it contain no metallic ion.

The techniques of forming wiring and plugs by CMP using a polishing solution containing the prior art abrasives for polishing metallic film as a main ingredient, however, has the following problems (1) to (7).

(1) There is observed a phenomenon that the superficial central part of metallic wiring inlaid in the grooves formed on the insulating film is excessively polished and concaved as compared with the peripheral parts (hereinafter, this phenomenon is called dishing) and a phenomenon that the superficial part of insulating film surrounding wiring is polished (hereinafter, this phenomenon is called erosion). Dishing and erosion incur an important problem especially in bonding pad and dense line pattern having a large area (about 0.1 mm square) of metallic part. This problem is mentioned in J. Electrochemical Soc. Vol. 141, No. 10, October 1994, pp. 2842–2848.

(2) The abrasive for polishing causes scratches. The scratches are formed not only on the surface of wiring metal layer but also on the surface of insulating film exposed by the CMP method.

(3) The procedure of CMP causes a high frictional force between the polishing abrasive particles and the surface of metal film, due to which delamination can occur between the metal film and the underlying insulating layer or between the SOG (spin on glass) of the underlying insulating layer and the chemical vapor deposition oxide film (hereinafter, referred to as CVD).

(4) A number of abrasive particles remain on the surface of wafer just after being subjected to CMP, which have to be cleaned off prior to the subsequent step until the number of the particles becomes under a predetermined value (for instance, until the number of particles having a size of 0.2 micrometer or above becomes 100 or less per wafer). This can be achieved only by using a cleaning machine carrying out not only a chemical cleaning but also a mechanical cleaning.

Generally, a combination of brush scrub cleaning and megasonic cleaning by the use of a chemical agent is adopted. The brushing material has to be a special material not injuring the surface of metal film. As the chemical agent, aqueous solutions of ammonium hydroxide, hydrofluoric acid, or the like are used, for instance. An example of such a post-CMP cleaning process is described in "Semiconductor World" May, 1995, page 172.

(5) The consumables used in CMP process are expensive, because production cost of abrasive is high and regulation of its particle size requires an extremely careful work. Particularly, alumina abrasive is several times more expensive than silica abrasive. The cost problem of CMP process is referred to in, for example, "Recent Topics and Problems in CMP Machines and Consumables" (Japanese), Saishin Gijutsu Koza, published by Realize Co., May 1996.

(6) In addition to the above-mentioned problems of CMP apparatus and post-cleaning apparatus, another problem must be referred to with regard to CMP-related apparatus and equipment. It is a problem that CMP requires an apparatus for supplying slurry and an apparatus for disposing the waste slurry and these apparatuses elevate the overall cost of CMP process greatly. Thus, the slurry supplying apparatus must have an agitator for preventing the sedimentation of abrasive and a mechanism for circulating slurry steadily for prevention of its sedimentation in piping. Further, the treatment of waste slurry is costly, and a technique for its reuse is also demanded.

(7) Another problem of CMP is that a CMP apparatus must be installed in a clean room in spite of the large quantity of dust-formable abrasive which CMP uses. Atmosphere of the clean room must be maintained on a high level of cleanliness by attaching a dust-controlling means such as exhaust duct to the CMP apparatus or by providing a special chamber in the clean room, which are both costly.

All the problems mentioned above are caused by the use of an abrasive-containing polishing slurry in the prior CMP method. Nevertheless, the use of abrasive has been indispensably necessary to the prior art CMP method for the purpose of realizing mechanical effect enough to remove the oxide layer formed by oxidizer rapidly. No practical velocity of polishing has been achievable without use of abrasive.

On the other hand, the present inventors have discovered a method for forming an inlaid interconnect structure by polishing a metal film with a polishing solution containing no abrasive, based on their studies up to today. That is, it has been found that an inlaid metal interconnect can be formed by mechanically polishing the surface of a metal film with a polishing solution comprising an oxidizer, a substance which renders an oxide water-soluble, water and, according to the need, a corrosion inhibitor. In an exemplified case of such a method, a copper interconnect is formed by the use of an abrasive-free polishing solution comprising aqueous hydrogen peroxide, citric acid and benzotriazole (hereinafter referred to as BTA).

Although the above-mentioned problems (1) to (7) can be solved by the use of such an abrasive-free polishing solution, there arises in such a case a new problem that the removal rate is lower than in the case of using an abrasive-containing polishing slurry, and especially a problem that the removal rate reaches a saturation and cannot be further elevated even under a high down force of 300 g/cm$^3$ or above. For example, in the case of commercially available alumina slurry, the removal rate can reach a high value of 200–400 nm/minute, even though the problem of scratch becomes more serious under such a condition. Contrariwise, in the case of the abovementioned abrasive-free polishing solution, the removal rate has been as low as about 100 to 150 nm/minute.

BRIEF SUMMARY OF THE INVENTION

The present invention has been accomplished in view of the problems mentioned above, and an object of the present invention is to provide a polishing method and a method for producing semiconductor devices which can realize a high removal rate in the formation of inlaid metallic interconnect.

Thus, the present invention provides a method for polishing metal film which comprises mechanically polishing the surface of metal film with a polishing solution comprising an oxidizer, a substance which renders an oxide water-soluble, a thickener (an agent which makes liquid viscous) and water.

The present invention further provides a method for producing a semiconductor device which comprises mechanically polishing the surface of metal film of a semiconductor substrate prepared by forming a metal film on an insulating film, with a polishing solution comprising an oxidizer, a substance which renders an oxide water-soluble, a thickener and water.

DETAILED DESCRIPTION OF THE INVENTION

The method of the present invention for polishing metal film can be achieved by polishing the surface of metal film mechanically with a polishing solution comprising an oxidizer, a substance rendering oxide water-soluble, a thickener and water.

If necessary, the polishing solution may contain a corrosion inhibitor.

As the oxidizer, hydrogen peroxide is most desirable, because it contains no metal. Ferric nitrate, nitric acid and potassium periodate also have a sufficient oxidizing power, and are suitable especially for polishing tungsten. If desired, these oxidizers may be used in the form of a combination of multiple substances.

As the substance which renders an oxide water-soluble, organic acids and salts thereof can be referred to. These substances have an action of converting an oxide into a water-soluble metallic ion such as $Cu^{2+}$, and such an action is utilized herein. Among organic acids, hydroxycarboxylic acids are particularly high in the effect of enhancing the removal rate. For example, organic acids typified by hydroxy acids such as citric acid, malic acid, malonic acid, succinic acid, tartaric acid, phthalic acid, maleic acid, fumaric acid, lactic acid, pimelic acid, adipic acid, glutaric acid, oxalic acid, salicylic acid, glycolic acid, benzoic acid and the like and carboxylic acids such as formic acid, acetic acid, propionic acid, butyric acid, valeric acid and the like and salts of these acids can be referred to. Besides above, chelating agents such as EDTA and the like can also be used. Salts have an action of enhancing the solubility, and salts containing no metallic component such as ammonium salts and salts containing an element exercising no adverse influence upon semiconductor element such as aluminum are desirable. If desired, these agents may be used in the form of a combination of multiple agents.

Of the acids mentioned above, citric acid, malic acid, malonic acid, succinic acid, tartaric acid and formic acid are preferably used in the polishing solution of the present invention from the viewpoint of high removal rate and low etching rate.

Of these acids, citric acid and malic acid are used generally as a food additive because of low toxicity, low harm in the state of waste polishing solution, odorlessness, and high water-solubility, so that they are especially suitable for use in the polishing solution of the present invention.

As the thickener, compounds having carboxyl group and phosphate group and especially polymers thereof are preferable from the viewpoint of improving the metal removal rate. For example, polyacrylic acid, polymethacrylic acid, polyvinylpyrrolidone, and their ammonium salts, triethanolamine salts, monoethanolamine salts, triethylamine salts, diisopropanolamine salts and the like can be referred to, and these acids and salts can be used effectively so far as their molecular weight and viscosity coefficient satisfy the condition mentioned below. A particularly high removal rate can be achieved by using crosslinked polyacrylic acid or salts thereof. If desired, these polymers may be used in the form of a combination of multiple polymers or in the form of a copolymer.

Molecular weight of the thickener is preferably 10,000 or above. Thickeners having a molecular weight of 100,000 or above give a more enhanced removal rate. Those having a molecular weight of several hundred millions, such as crosslinked polymers, are further preferable.

Viscosity coefficient (viscosity) of the thickener itself is preferably 100 cP or above in the form of 1 wt % aqueous solution. Thickeners having a viscosity coefficient (viscosity) of 1,000 cP or above give a higher removal rate. Viscosity coefficient of the polishing solution is preferably 10 cP or above at room temperature. Polishing solutions having a viscosity coefficient of 100 cP or above give a higher removal rate. Additionally saying, viscosity coefficient of pure water at room temperature is 1 cP.

As the substance for suppressing excessive oxidation and etching of metal film, corrosion inhibitors are effectively usable. Although some thickeners have an anti-corrosive characteristic in themselves, addition of an additionally stronger inhibitor to the polishing solution makes it possible to suppress the dishing. As a corrosion inhibitor for copper alloys, benzotriazole (hereinafter, referred to as BTA) is most effective. Besides BTA, derivatives of BTA such as tolyltriazole (hereinafter referred to as TTA), BTA-carboxylic acid (hereinafter, referred to as BTA-COOH) and the like, cystein, haloacetic acid, glucose, dodecylmercaptan, quinaldic acid and the like also have an anti-corrosive activity and are usable practically.

As to the polishing abrasive, alumina abrasive and silica abrasive are expected to increase the removal rate when incorporated into the polishing solution of the present invention. However, their incorporation incurs the above-mentioned problems (1) to (7), and therefore these abrasives can be used only in cases where such problems make no trouble.

As the metal films to be polished to which the present invention is applicable, films of Cu, W, Ti, TiN, Ta, TaN, Al, etc. can be referred to. Of these metals, Cu exhibits the highest removal rate and therefore is most suitable as the objective metal of the invention. Although W, Ti and TiN are inferior to Cu in removal rate, they are suitable for use in cases where film thickness of polishing is thin (for example, in case of barrier film of Cu wiring having a film thickness of several tens nm).

Figure 3A:
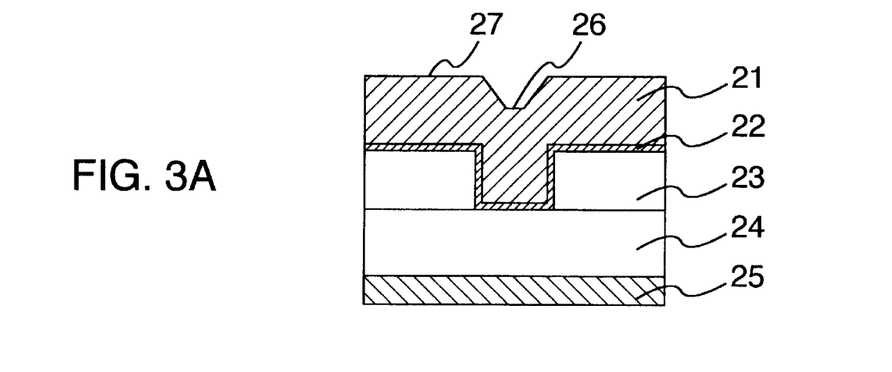
FIG. 3A is a view illustrating the cross-sectional structure of interconnect part of a sample before CMP.

If CMP is carried out with a polishing solution containing the substances mentioned above, coating and protection of the surface of metal film by the polymer (thickener) takes place first of all. The convex part 27 of metal film surface, as shown in FIG. 3A, is always mechanically polished by the polishing pad and therefore the protecting polymer film formed thereon is readily removed. The metal film surface exposed to the polishing solution is oxidized by the oxidizer, and a thin oxide film is formed on the surface. Subsequently, a substance which renders the oxide water-soluble is supplied, and the oxide layer dissolves in the aqueous solution with a decrease in the thickness of the oxide layer. The portion where thickness of oxide layer has decreased is again exposed to the oxidizer, which results in an increase in thickness of oxide layer. While repeating these reactions, CMP progresses. Accordingly, in the convex part 27 of the metal film surface, the reaction product present on the surface is readily removed and local heating of such a part takes place to accelerate the reactions. Thus, the above-mentioned repeated reaction of oxidation/water-solubilization progresses more rapidly than in the concave part 26 which is protected with polymer film. As a result, the removal rate is higher in the convex part 27 than in the concave part 26, so that planarization progresses.

The corrosion inhibitor adherent onto the metal surface additionally suppresses the reaction in the concave part. Thus, it ultimately inhibits the occurrence of dishing. As a rough measure, it is desirable to regulate the concentration of corrosion inhibitor so as to give a removal rate of 50 nm/min. or above and an etching rate of several nm/min. or below, or to maintain the removal rate/etching rate ratio at about 50. If the concentration of corrosion inhibitor is higher than the above, the removal rate may decrease. However, it should be noted that polishing into a well planarized surface can be achieved without addition of corrosion inhibitor, so far as a sufficiently high removal rate can be realized without addition of corrosion inhibitor and the etching rate is as small as less than several nm/min.

The polishing solution preferably comprises 0.5 to 30% by weight of the oxidizer, 0.01 to 1% by weight of the substance which renders an oxide water-soluble, 0.01 to 5% by weight of the thickner, 0 to 5% by weight, more preferably 0.001 to 5% by weight of the corrosion inhibitor, and the reminder being water. More preferably, the polishing solution comprises 3 to 15% by weight of the oxidizer, 0.05 to 0.4% by weight of the substance which renders an oxide water-soluble, 0.03 to 0.3% by weight of the thickner, 0.01 to 0.5% by weight of the corrosion inhibitor, and the reminder being water.

The method for producing a semiconductor according to the present invention can be put into practice according to the embodiments mentioned below.

(A) A method for producing a semiconductor device comprising the steps of:
  preparing a substrate having an impurity-doped layer,
  forming an insulating film having an opening on said impurity-doped layer,
  forming a metal film on the substrate on which the insulating film is formed,
  mechanically polishing the surface of the metal film by the use of a polishing solution comprising an oxidizer, a substance which renders an oxide water-soluble, a thickener and water and thereby exposing the insulating film,
  thereafter cleaning the substrate, and
  drying the cleaned substrate.

(B) A method for producing a semiconductor device comprising the steps of:
  preparing a substrate having a first wiring layer,
  forming a first insulating film having an opening in which the first wiring layer is exposed,
  forming a metal film on said substrate with the insulating film formed thereon,
  mechanically polishing the surface of the metal film by the use of a polishing solution comprising an oxidizer, a substance which renders an oxide water-soluble, a thickener and water and thereby exposing the insulating film, thereafter cleaning the substrate, and drying the cleaned substrate.

(C) A method for producing a semiconductor device comprising the steps of:

preparing a substrate having a conductor layer, forming an insulating film having an opening on said conductor layer, forming a layered film comprising a titanium nitride film and a metal film containing copper on the substrate with said insulating film formed thereon, mechanically polishing the surface of said metal film by the use of a polishing solution comprising aqueous hydrogen peroxide, citric acid or malic acid, and crosslinked polyacrylic acid or a salt of crosslinked polyacrylic acid, thereafter cleaning said substrate, and drying the cleaned substrate.

(D) A method for producing a semiconductor device comprising the steps of:

preparing a substrate having a conductor layer, forming an insulating film having an opening on said conductor layer, forming a layered film comprising a titanium nitride film and a metal film consisting mainly of copper on the substrate with said insulating film formed thereon, mechanically polishing the surface of said metal film by the use of a polishing solution comprising aqueous hydrogen peroxide, citric acid or malic acid, and polyacrylic acid or a salt of polyacrylic acid, said polishing solution having a viscosity coefficient of 10 cP or above at room temperature, thereafter cleaning said substrate, and drying the cleaned substrate.

Next, the present invention will be explained concretely by referring to examples and drawings.

EXAMPLE 1

Figure 1:
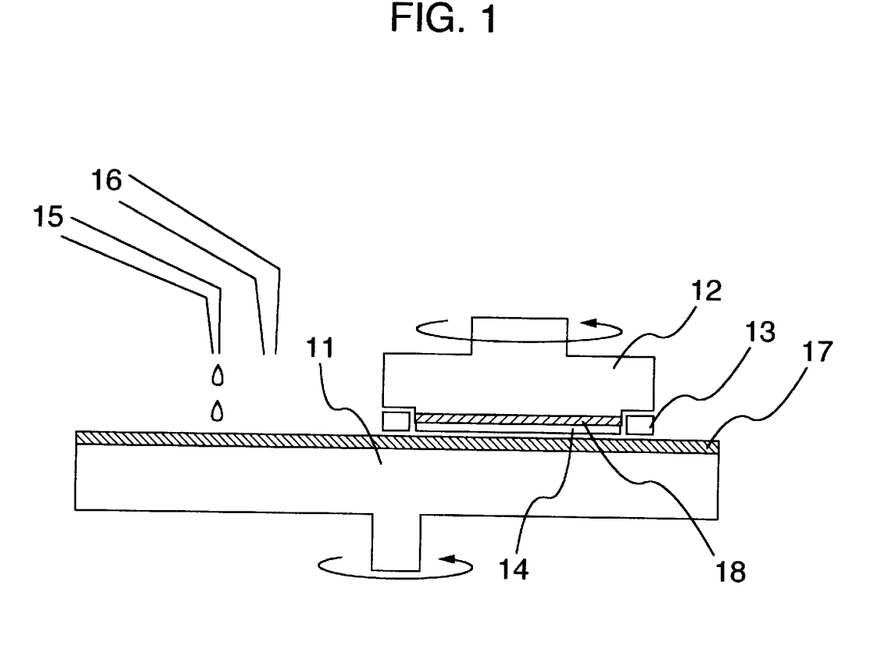
FIG. 1 is an outlined view illustrating a CMP apparatus used for carrying out the polishing method of the present invention.

In this Example, a method for forming a copper wiring by carrying out CMP of copper will be described. FIG. 1 is an outlined view illustrating the CMP apparatus used in an example of the present invention. The apparatus was so constructed as to carry out CMP by rotating the holder 12 supporting a wafer 14 by a backing pad 18 on platen 11 to which a polishing pad 17 was applied. A retaining ring 13 was provided to prevent dislocation of the wafer in the process of CMP. The down force in the process of CMP was controlled by placing a weight on the holder 12. Under standard conditions, the down force was adjusted to 220 g/cm$^2$, the rotational frequency of platen to 60 rpm, and the rotational frequency of holder to 40 rpm, although the values of down force and rotational frequencies are not limited to the above-mentioned ones. As the polishing pad, hard polishing pad IC1000, manufactured by Rodel Co., was used.

CMP was carried out while dropping the polishing solution of the invention at a rate of about 100 cc/min. onto the polishing pad from the first feeder 15 (for polishing solution) provided over the platen 11. At the time when CMP was completed, the first feeder 15 was closed to stop the feed of polishing solution, and pure water was fed from the second feeder 16 (for pure water) at a rate of about 3,000 cc/min. to rinse the wafer for 15 to 30 seconds. Thereafter, the polishing solution was removed by brush scrub cleaning, while keeping the wafer prevented from dryness. Then, the wafer was dried.

First, polishing characteristics of the polishing solution of the present invention were investigated with a wafer having no wiring pattern formed thereon. The sample was prepared by forming a silicon oxide film of 200 nm thick on a silicon wafer, and then continuously forming a TiN film of 50 nm thick, as an adhesive layer, and a Cu film of 800 nm thick by the sputtering method in vacuum. The wafer had a diameter of 5 inches.

Figure 2:
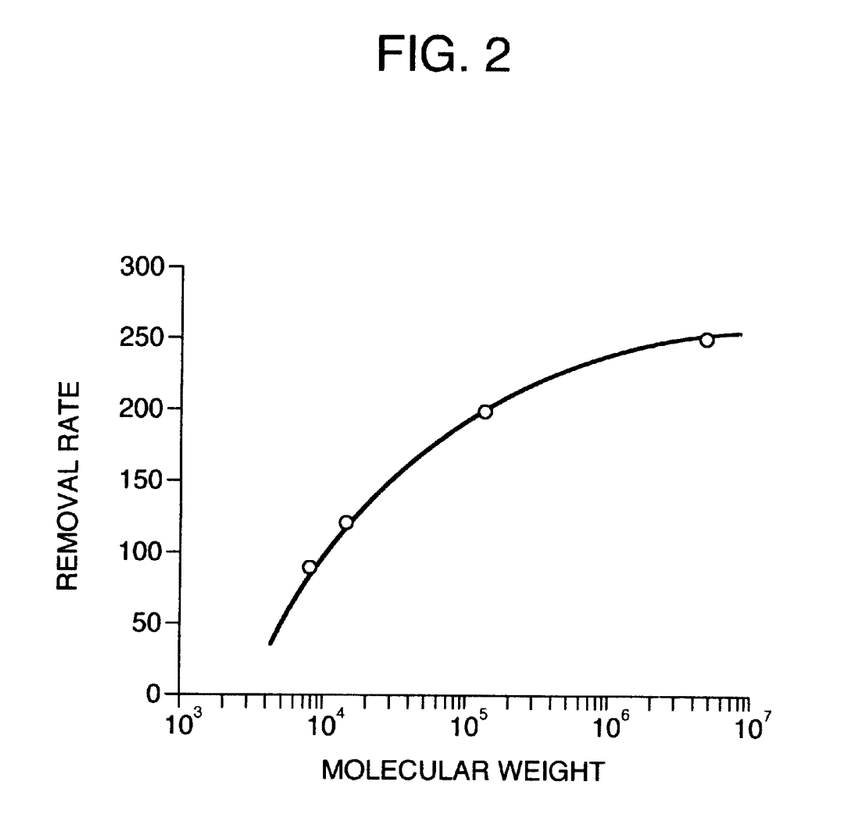
FIG. 2 is a graph illustrating the dependence of the Cu removal rate on the molecular weight of thickener.

The polishing solution used in this example was an aqueous solution constituted of an aqueous hydrogen peroxide (commercially available 30% aqueous solution of $H_2O_2$), citric acid and a polyacrylic acid of which molecular weight was varied as shown in FIG. 2. The formulation was as follows: 30% by volume of aqueous hydrogen peroxide, 0.15% by weight of citric acid, and 0.1% by weight of polyacrylic acid. Using this polishing solution, removal rate and etching rate of the Cu film were measured. As used herein, the term "etching rate" means the rate at which the surface of Cu film is etched when the sample is dipped in a polishing solution. If etching makes progress excessively in the process of CMP, no wiring structure can be formed. Accordingly, as low an etching rate as possible is desirable. The polishing solution was kept at room temperature. The removal rate and the etching rate were calculated from the change in electric resistance of Cu film.

FIG. 2 illustrates the dependence of Cu removal rate on molecular weight of acrylic acid. A polishing solution containing a polyacrylic acid having a molecular weight lower than 10,000 gave a removal rate of 90 nm/min., while a polishing solution containing a polyacrylic acid having a molecular weight of 140,000 gave a removal rate of 200 nm/min, and a polishing solution containing a crosslinked polymer having a molecular weight exceeding 1,000,000 gave a removal rate of 250 nm/min. In all the polishing solutions, the etching rate was so controlled as not to exceed 1.0 nm/min., and there was no problem of dishing.

FIG. 3A illustrates an example of cross-sectional structure of a sample before polishing from which an inlaid interconnect is to be formed. On a silicon substrate 25 on which an impurity-doped layer and an insulating film had previously been formed, a BPSG film (silicon oxide film to which boron and phosphorus are added) 24 of 500 nm thick and a silicon oxide film 23 of 500 nm thick were formed, and a wiring groove pattern having a depth of 500 nm was formed in the silicon oxide film 23 by lithographic process and dry etching process. Further, a TiN layer 22 of 50 nm thick as an adhesion layer was formed thereon, and then a copper thin film 21 of 800 nm thick was continuously formed by sputtering process in vacuum. Further, the sample was subjected to a vacuum heat treatment at 450° C. for 3 minutes in a sputtering machine for improving the coverage. Although impurity-doped layers such as source, drain, etc. were also formed on the silicon substrate 25, they are not shown herein.

Figure 3B:
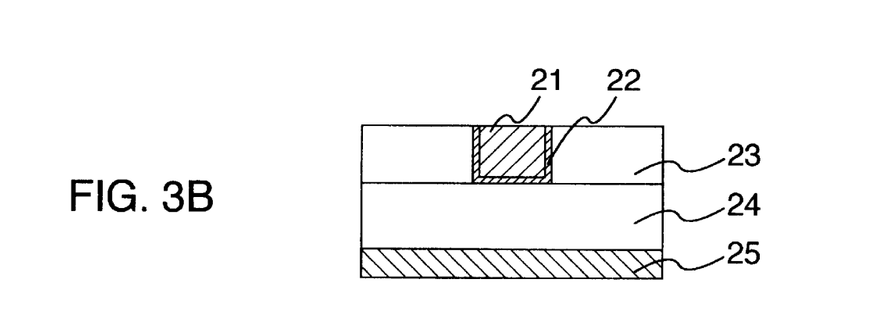
FIG. 3B is a view illustrating the cross-sectional structure of an interconnect part of a sample after CMP.
Figure 3C:
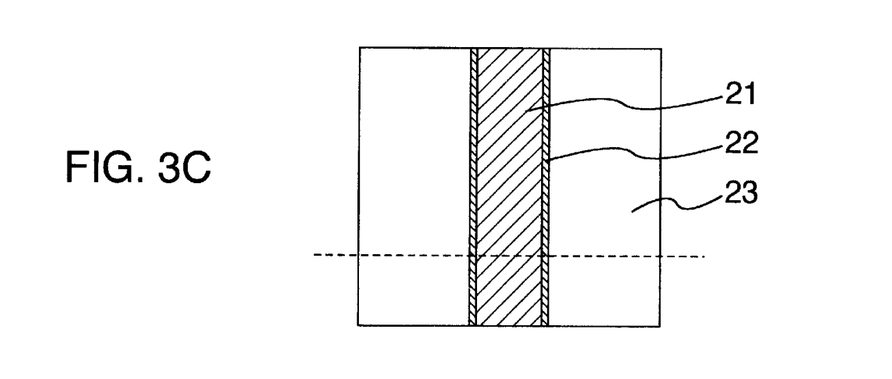
FIG. 3C is a plan view illustrating a sample after CMP; provided that the dotted line expresses the position of cross-section in FIG. 3B.

The sample obtained above was subjected to CMP using the above-mentioned polishing solution. As a result, the sample could be fabricated with any of the polishing solutions into a shape in which dishing and erosion were both not exceeding about 50 nm, without occurrence of delamination as shown in FIG. 3B and FIG. 3C. The period of time required for completing polishing in a run using a polishing solution containing a polyacrylic acid having a molecular weight of 140,000 was about a half of the period of time required in a run using a polishing solution containing a polyacrylic acid having a molecular weight of 10,000. In a run using a polishing solution containing a polyacrylic acid having a molecular weight exceeding 1,000,000, the polishing could be completed in 40% period as compared with the case where the molecular weight of acrylic acid was 10,000.

On the copper wiring thus formed, electric resistivity was measured. As a result, there was obtained a result of 1.9 micro-Ohm centimeter, which included that of the TiN layer parts, too. Continuity/insulation tests were carried out on a zigzag wiring (width of wiring 0.3–3 micrometers, length 40 mm) and a comb-like wiring (interval between wirings 0.3–3 micrometers, length 40 mm), and there were obtained yields of approximately 100%. Performance characteristics of LSI were found to be normal.

EXAMPLE 2

The polishing solution used in this example was an aqueous solution constituted of aqueous hydrogen peroxide (commercially available 30% aqueous solution of $H_2O_2$), malic acid and a polyacrylate ammonium salt of which molecular weight was varied. The formulation was as follows: aqueous hydrogen peroxide 30% by volume, malic acid 0.15% by weight, and polyacrylate ammonium salt 0.1% by weight. Using the polishing solution, removal rate and etching rate of Cu film were measured. The polishing characteristics were evaluated in the same manner as in Example 1.

Figure 4:
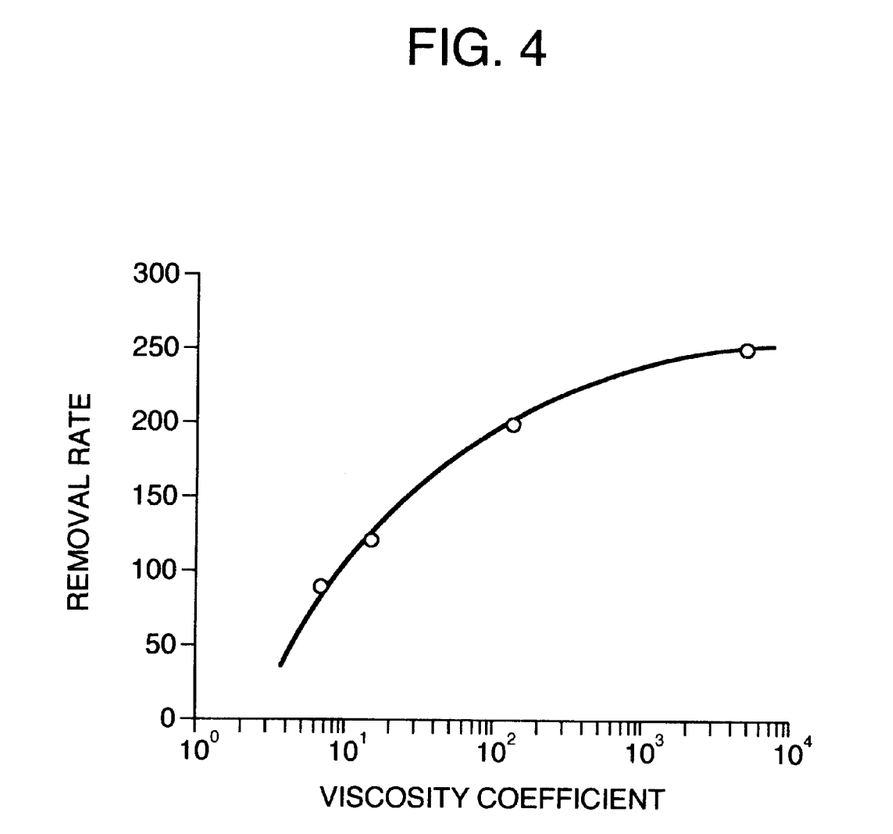
FIG. 4 is a graph illustrating the dependence of Cu removal rate on the viscosity coefficient of polishing solution.

FIG. 4 illustrates the results of investigation on the dependence of removal rate of Cu on the viscosity coefficient of polishing solution. In a run using a polishing solution containing a polyacrylate ammonium salt having a viscosity coefficient of less than 10, the removal rate was 90 nm/min. In a run wherein the viscosity coefficient was 120, the removal rate was 200 nm/min., and in a run using a polishing solution containing a crosslinked polymer having a molecular weight exceeding 1,000, the removal rate was 250 nm/min. In all the runs, the etching rate Was so controlled as not to exceed 1.0 nm/min., and there occurred no problem of dishing.

A sample on which an inlaid interconnect was to be formed was subjected to CMP using each of the above-mentioned polishing solutions. As a result, as seen in FIG. 3B and FIG. 3C, the sample could be fabricated into a shape in which dishing and erosion did not exceed ca. 50 nm, with any of the polishing solutions, without occurrence of delamination. In a run using a polishing solution containing a polyacrylate ammonium salt having a viscosity coefficient of 120, the polishing could be completed in a half period of time as compared with the case of using a polishing solution wherein the viscosity coefficient was 10. In a run using a polishing solution containing a polyacrylate ammonium salt having a viscosity coefficient exceeding 1,000, the polishing could be completed in a 40% period as compared with the case of using a polishing solution wherein the viscosity coefficient of polyacrylate ammonium salt was 10.

On the copper wiring thus formed, electric resistivity was measured. As a result, there was obtained a result of 1.9 micro-Ohm centimeter, which included that of the TiN layer parts, too. Continuity/insulation tests were carried out on a zigzag wiring (width of wiring 0.3–3 micrometers, length 40 mm) and a comb-like wiring (interval between wirings 0.3–3 micrometers, length 40 mm), and there were obtained yields of approximately 100%. Performance characteristics of LSI were found to be normal.

EXAMPLE 3

In this Example, the method for forming an inlaid plug of W will be explained. The polishing solution used was an aqueous solution constituted of an aqueous hydrogen peroxide (commercially available 30% aqueous solution of $H_2O_2$), malic acid, malonic acid, adipic acid, and a polyacrylate triethanolamine salt of which molecular weight was varied. The formulation was s follows: aqueous solution of hydrogen peroxide 10% by volume, malic acid 0.01% by weight, malonic acid 0.03% by weight, adipic acid 0.1% by weight, and polyacrylate triethanolamine salt 0.01% by weight. Using this polishing solution, removal rate and etching rate of a W film formed by CVD were measured. The polishing characteristics were evaluated in the same manner as in Example 1, provided that the down force was 400 $g/cm^2$.

Figure 5:
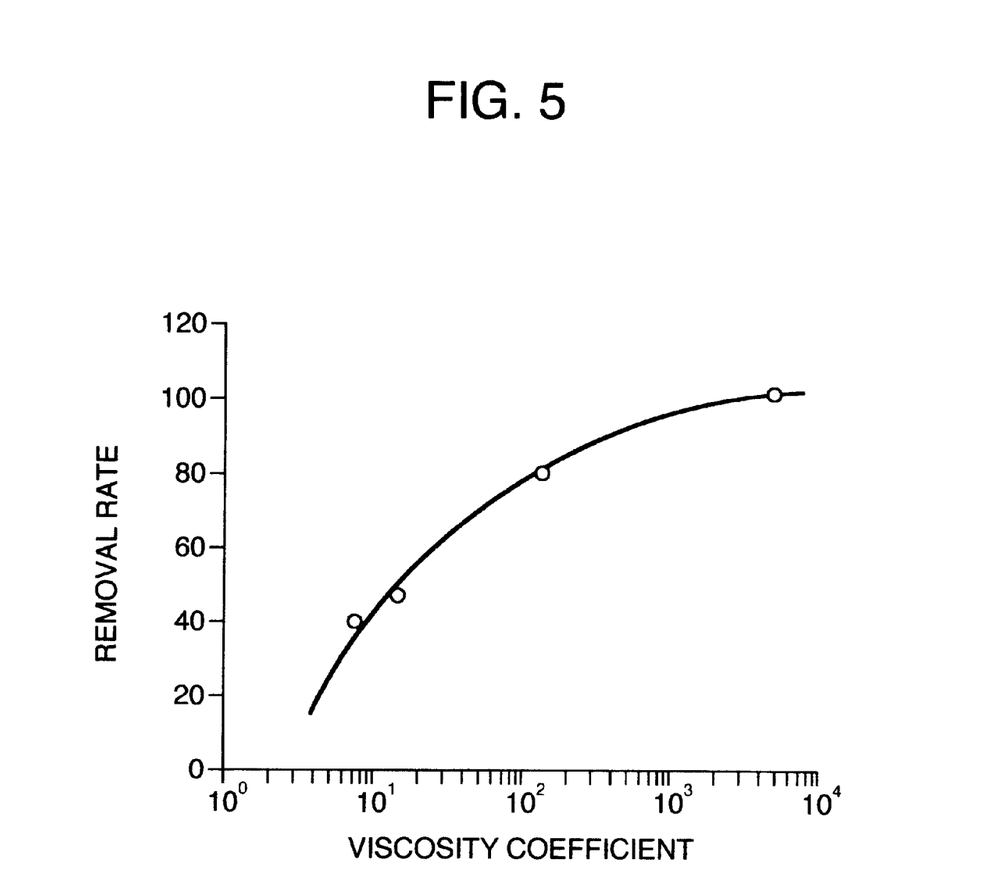
FIG. 5 is a graph illustrating the dependence of W removal rate on the viscosity coefficient of polishing solution.

FIG. 5 illustrates the result of an investigation on the dependence of removal rate of W on the viscosity coefficient of polishing solution. In a run using a polishing solution containing a polyacrylate triethanolamine salt having a viscosity coefficient of less than 10, the removal rate was 40 nm/min. In a run using a polishing solution wherein the viscosity coefficient was 120, the removal rate was 80 nm/min., and in a run using a polishing solution containing a crosslinked polymer having a viscosity coefficient exceeding 1,000, the removal rate was 100 nm/min. In all the runs, the etching rate of polishing solution was so controlled as not to exceed 1.0 nm/min., and there occurred no problem of dishing.

Figure 6A:
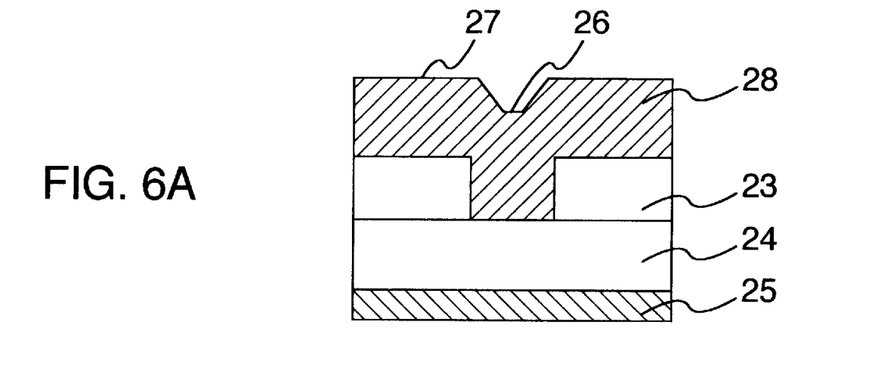
FIG. 6A is a view illustrating the cross-sectional structure of plug part of a sample before CMP.
Figure 6B:
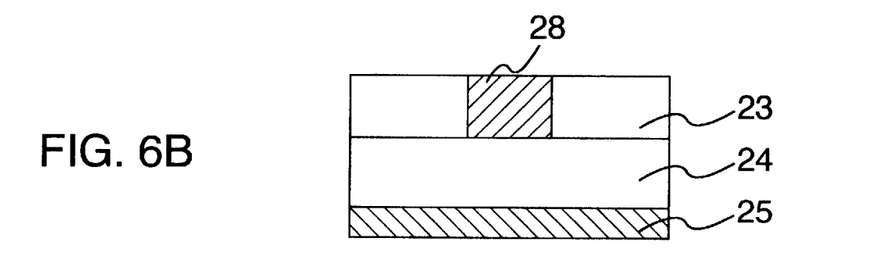
FIG. 6B is a view illustrating the cross-sectional structure of plug part of a sample after CMP.
Figure 6C:
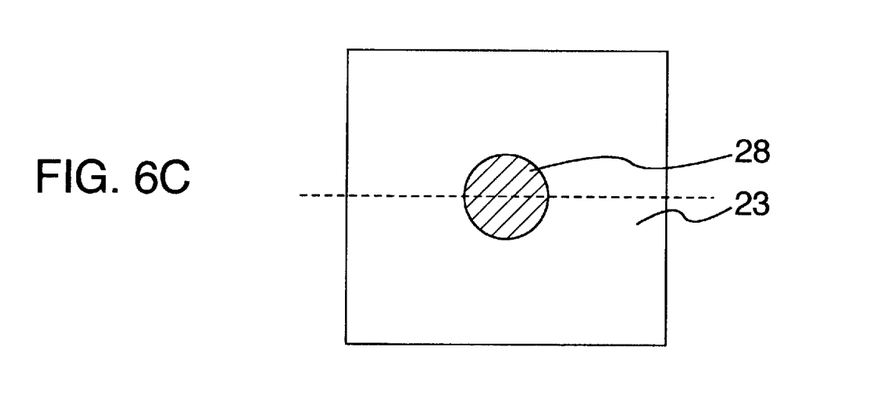
FIG. 6C is a plan view illustrating a sample after CMP; provided that the dotted line expresses the position of cross-section in FIG. 6B.

A sample from which an inlaid W plug was to be formed (FIG. 6A) was subjected to CMP with each of the above-mentioned polishing solutions. As a result, as seen in FIG. 6B and FIG. 6C, the sample could be fabricated into a shape in which the dishing and erosion were both about 50 nm or less, with any of the polishing solutions. No-occurrence of delamination was observed. In a run using a polishing solution containing a polyacrylate triethanolamine salt having a viscosity coefficient of 120, the polishing could be completed in about a half period of time as compared with the case of using a polishing solution wherein the viscosity coefficient was 10. In a run using a polishing solution containing a polyacrylate triethanolamine salt having a viscosity coefficient exceeding 1,000, the polishing could be completed in a 40% period of time as compared with the case of using a polishing solution wherein the viscosity coefficient was 10.

In FIG. 6A to FIG. 6C, 23 to 27 are the same as those in FIG. 3, and 28 is W film.

On the W plug thus formed, electric resistivity was measured. As a result, there was obtained a result of 20 micro-Ohm centimeter. Using a via chain in which 100 plugs were formed continuously, a continuity/insulation test was carried out. As a result, there was obtained a result of 100%. The performance characteristics of LSI were found to be normal.

The method of the present invention which carries out CMP with a polishing solution containing a thickener can achieve a polishing at a higher removal rate with more suppressed scratching, delamination, dishing and erosion, as compared with the CMP methods using prior polishing solutions.

What is claimed is:

1. A polishing method for removing, at least partially, a metal film formed on an insulating film, which comprises, mechanically polishing the surface of said metal film using a polishing pad which does not include abrasives and an abrasive-free polishing solution comprising an oxidizer, a substance which renders a metal oxide water-soluble, a thickener and water.

2. A polishing method according to claim 1, wherein said thickener has a molecular weight of at least 10,000.

3. A polishing method according to claim 1, wherein said thickener has a viscosity coefficient of at least 100 cP in the sate of 1 weight percent aqueous solution.

4. A polishing method according to claim 1, wherein said polishing solution has a viscosity coefficient of at least 10 cP at room temperature.

5. A polishing method according to claim 1, wherein said thickener is polyacrylic acid.

6. A polishing method according to claim 1, wherein said thickener is a polyacrylate ammonium salt or a polyacrylate amine salt.

7. A polishing method according to claim 1, wherein said thickener is a crosslinked polymer.

8. A polishing method for removing, at least partially, a metal film formed on an insulating film, which comprises mechanically polishing the surface of said metal film using a polishing pad which does not include abrasives and an abrasive-free polishing solution comprising an oxidizer, a substance which renders a metal oxide water-soluble, a thickener a corrosion inhibitor and water.

9. A polishing method according to claim 8, wherein the corrosion inhibitor is benzotriazole or a derivative thereof.

10. A polishing method according to claim 1, wherein said oxidizer is hydrogen peroxide.

11. A polishing method according to claim 1, wherein said substance which renders an oxide water-soluble comprises an organic acid or a salt thereof.

12. A polishing method according to claim 11, wherein said organic acid is a hydroxycarboxylic acid.

13. A polishing method according to claim 12, wherein said hydroxycarboxylic acid is malic acid or citric acid.

14. A polishing method according to claim 1, wherein said metal film comprises copper, a copper alloy containing mainly copper or a copper compound.

15. A polishing method according to claim 1, wherein said metal film comprises tungsten, a tungsten alloy or a tungsten compound.

16. A polishing method according to claim 1, wherein said metal film comprises titanium nitride, tantalum or tantalum nitride.

17. A polishing method for removing, at least partially, a metal film formed on an insulating film, which comprises mechanically polishing the surface of said metal film using a polishing pad which does not include abrasives and an abrasive-free polishing solution comprising aqueous hydrogen peroxide; citric acid or malic acid; benzotriazole or a derivative thereof; and polyacrylic acid or a polyacrylate ammonium salt having a molecular weight of at least 10,000.

18. A method for producing a semiconductor device, which comprises the steps of:

preparing a substrate having an impurity-doped layer, forming an insulating film having an opening on said impurity-doped layer, forming a metal film on the substrate on which the insulating film is formed, mechanically polishing the surface of the metal film by the use a polishing pad which does not include abrasives and of an abrasive-free polishing solution comprising an oxidizer, a substance which renders a metal oxide water-soluble, a thickener, a corrosion inhibitor and water, and thereby exposing the insulating film, thereafter cleaning the substrate, and drying the cleaned substrate.

19. A method for producing a semiconductor device, which comprises the steps of:

preparing a substrate having a first wiring layer, forming a first insulating film having openings in which the first wiring layer is exposed, forming a metal film on said substrate on which the insulating film is formed, mechanically polishing the surface of the metal film by the use a polishing pad which does not include abrasives and of an abrasive-free polishing solution comprising an oxidizer, a substance which renders a metal oxide water-soluble, a thickener, a corrosion inhibitor, and water, and thereby exposing the insulating film, thereafter cleaning the substrate, and drying the cleaned substrate.

20. A method for producing a semiconductor device, which comprises the steps of:

preparing a substrate having a conductor layer, forming an insulating film having an opening on said conductor layer, forming a laminated film comprising a titanium nitride film and a metal film containing copper on said substrate on which insulating film is formed, mechanically polishing the surface of said metal film by the use a polishing pad which does not include abrasives and of an abrasive-free polishing solution comprising aqueous hydrogen peroxide, citric acid or malic acid, benzotriazole or a derivative thereof, and crosslinked. polyacrylic acid or a salt of crosslinked polyacrylic acid, thereafter cleaning said substrate, and drying the cleaned substrate.

21. A method for producing a semiconductor device, which comprises the steps of:

preparing a substrate having a conductor layer, forming an insulating film having an opening on said conductor layer, forming a laminated film comprising a titanium nitride film and a metal film consisting mainly of copper on said substrate on which the insulating film is formed, mechanically polishing the surface of said metal film by the use a polishing pad which does not include abrasives and of an abrasive-free polishing solution comprising aqueous hydrogen peroxide, and citric acid or malic acid, benzotriazole or a derivative thereof, and polyacrylic acid or a salt of polyacrylic acid, said polishing solution having a viscosity coefficient of at least 10 cP, thereafter cleaning said substrate, and drying the cleaned substrate.

* * * * *